(12) United States Patent
Saito et al.

(10) Patent No.: US 8,373,247 B2
(45) Date of Patent: Feb. 12, 2013

(54) SEMICONDUCTOR DEVICE

(75) Inventors: Wataru Saito, Kanagawa-ken (JP);
Syotaro Uno, Kanagawa-ken (JP);
Munehisa Yabuzaki, Hyogo-ken (JP);
Shunji Taniuchi, Kanagawa-ken (JP);
Miho Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 13/029,925

(22) Filed: Feb. 17, 2011

(65) Prior Publication Data
US 2011/0215418 A1 Sep. 8, 2011

(30) Foreign Application Priority Data

Mar. 3, 2010 (JP) ................................. 2010-046394

(51) Int. Cl.
*H01L 29/06* (2006.01)
(52) U.S. Cl. ................................. 257/490; 257/E29.012
(58) Field of Classification Search .................. 257/107, 257/170, 409, 452, 484, 490, 494, 495, 605, 257/E29.012, E2.0139
See application file for complete search history.

(56) References Cited

U.S. PATENT DOCUMENTS

| 6,300,171 B1* | 10/2001 | Frisina ........................... 438/140 |
| 2006/0043480 A1* | 3/2006 | Tsuchitani et al. ........... 257/341 |
| 2007/0272977 A1 | 11/2007 | Saito et al. |
| 2007/0272979 A1 | 11/2007 | Saito et al. |

FOREIGN PATENT DOCUMENTS

| JP | 2000-101082 | 4/2000 |
| JP | 2000-183350 | 6/2000 |
| JP | 2009-088345 | 6/2000 |
| JP | 2000-277726 | 10/2000 |

* cited by examiner

*Primary Examiner* — Evan Pert
*Assistant Examiner* — Selim Ahmed
(74) *Attorney, Agent, or Firm* — Patterson & Sheridan, LLP

(57) ABSTRACT

According to one embodiment, a semiconductor device includes a first semiconductor region of a first conductivity type, a second semiconductor region of the first conductivity type, a first main electrode, a third semiconductor region of a second conductivity type, a second main electrode, and a plurality of embedded semiconductor regions of the second conductivity type. The second semiconductor region is formed on a first major surface of the first semiconductor region. The first main electrode is formed on a face side opposite to the first major surface of the first semiconductor region. The third semiconductor region is formed on a second major surface of the second semiconductor region on a side opposite to the first semiconductor region. The second main electrode is formed to bond to the third semiconductor region. The embedded semiconductor regions are provided in a termination region. A distance between the embedded semiconductor region and the second major surface along a direction from the second major surface toward the first major surface becomes longer toward outside from the device region.

16 Claims, 9 Drawing Sheets

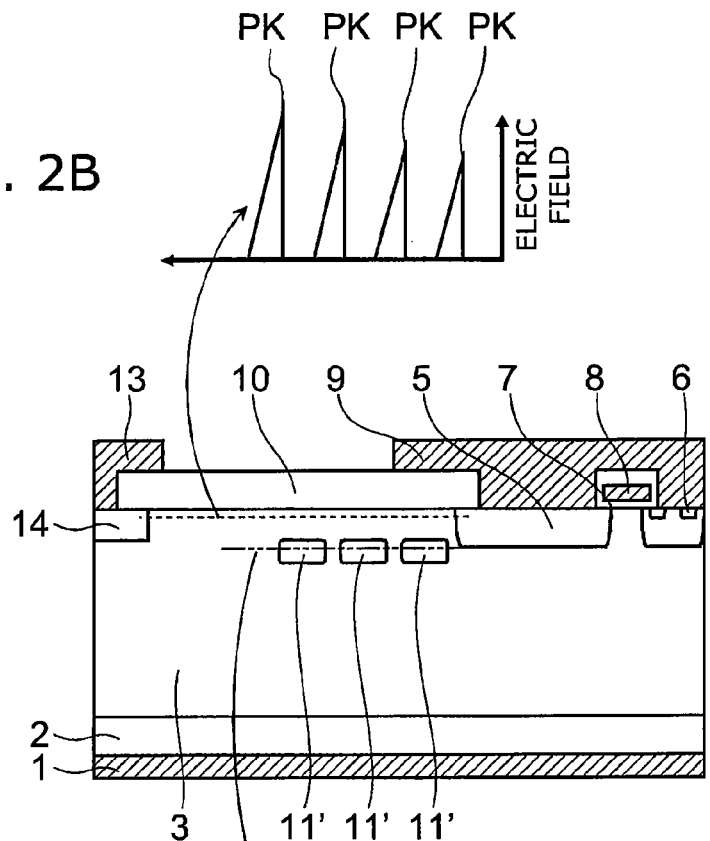
FIG. 2B
FIG. 2C
FIG. 2A

US 8,373,247 B2

SEMICONDUCTOR DEVICE

CROSS-REFERENCE TO RELATED APPLICATIONS

This application is based upon and claims the benefit of priority from the prior Japanese Patent Application No. 2010-046394, filed on Mar. 3, 2010; the entire contents of which are incorporated herein by reference.

FIELD

Embodiments described herein relate generally to a semiconductor device.

BACKGROUND

In a vertical power device such as a vertical MOSFET (Metal-Oxide-Semiconductor Field-Effect Transistor) and an IGBT (Insulated Gate Bipolar Transistor), an applied voltage is maintained by extending a depletion layer in the vertical direction of a drift layer. In such a device, in a termination region located on an outer periphery of a cell region through which an electric current flows, a depletion layer also extends laterally. Thus, an electric field is generated on the surface of the termination region. At this time, if an electric field distribution of the termination region is changed by an influence from outside the device, it causes reliability deterioration such as fluctuation in a breakdown voltage of the device or a leak current.

In order to ensure reliability of the vertical power device, the electric field distribution on the surface of the termination region needs to be optimized. If the electric field on the surface is high, impact ionization occurs, and a generated hot carrier jumps into a field insulating film. The electric field distribution of the termination region is changed by a charge of the carrier which has jumped in, and reliability is deteriorated.

In order to ensure the termination breakdown voltage, a structure in which a guard ring (hereinafter also referred to as GR) layer is formed on the surface of the termination region is proposed (See JP-A 2000-277726 (Kokai), for example). Also, a structure in which an embedded GR layer is formed in a drift layer of the termination region is proposed (See JP-A 2009-88345, for example).

In the structure in which the GR layer is formed, the electric field distribution can be changed by a design of the number of GRs and an interval between the GRs. However, if the electric field on the surface is to be reduced, the number of GRs needs to be increased, which enlarges the termination region. In a device of a limited size, a problem is caused that the enlarged termination region reduces an effective area in the device through which an electric current flows.

BRIEF DESCRIPTION OF THE DRAWINGS

FIGS. 2A to 2C are schematic cross-sectional views for explaining a comparative example;

DETAILED DESCRIPTION

Figure 1B:
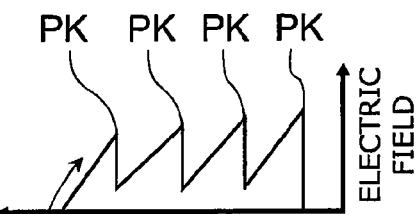
FIGS. 1A to 1C are cross-sectional views schematically illustrating an example of the configuration of a power MOSFET for explaining a first embodiment.

In general, according to one embodiment, a semiconductor device includes a first semiconductor region of a first conductivity type, a second semiconductor region of the first conductivity type, a first main electrode, a third semiconductor region of a second conductivity type, a second main electrode, and a plurality of embedded semiconductor regions of the second conductivity type. The second semiconductor region is formed on a first major surface of the first semiconductor region. The first main electrode is formed on a face side opposite to the first major surface of the first semiconductor region. The third semiconductor region is formed on a part of a second major surface of the second semiconductor region on a side opposite to the first semiconductor region. The second main electrode is formed to bond to the third semiconductor region. The plurality of embedded semiconductor regions are provided in a termination region. The termination region is an outside of a device region. A main electric current path is formed between the first main electrode and the second main electrode in the device region of the second semiconductor region. A distance between the embedded semiconductor region and the second major surface along a direction from the second major surface toward the first major surface becomes longer toward outside from the device region.

According to another embodiment, a semiconductor device includes a first semiconductor region of a first conductivity type, a second semiconductor region of the first conductivity type, a first main electrode, a third semiconductor region of a second conductivity type, a fourth semiconductor region of the first conductivity type, a second main electrode, a control electrode, and a plurality of embedded semiconductor regions of the second conductivity type. The second semiconductor region is formed on a first major surface of the first semiconductor region. The first main electrode is formed on a face on a side opposite to the first major surface of the first semiconductor region. The third semiconductor region is formed on a part of a second major surface of the second semiconductor region on a side opposite to the first semiconductor region. The fourth semiconductor region is formed on the third semiconductor region. The second main electrode is formed to bond to the third semiconductor region and the fourth semiconductor region. The control electrode is formed via a gate insulating film over the third semiconductor region, the fourth semiconductor region, and the second semiconductor region. The plurality of embedded semiconductor regions are provided in a termination region. The termination region is an outside of a device region. A main electric current path is formed between the first main electrode and the second main electrode in the device region of the second semiconductor region. A distance between the embedded semiconductor region and the second major surface along a direction from the second major surface toward the first major surface becomes longer toward outside from the device region.

Exemplary embodiments of the invention will now be described with reference to the drawings. In the following embodiments, it is assumed, as an example, that a semiconductor is silicon, a first conductivity type is an n-type, and a second conductivity type is a p-type. Also, similar components in the drawings hereinbelow are marked with like reference numerals.

First Embodiment

Figure 1C:
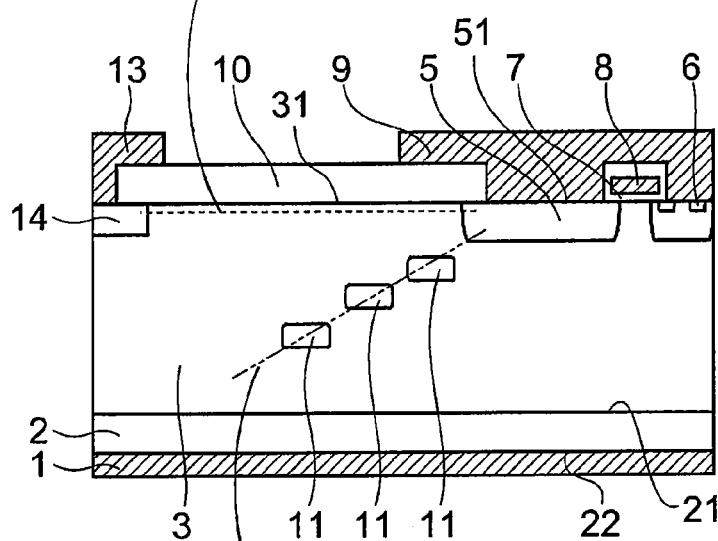
Figure 1A:
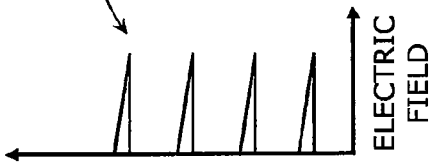

FIGS. 1A to 1C are cross-sectional views schematically illustrating an example of the configuration of a power MOSFET for explaining a first embodiment. In this MOSFET, on one major surface (first major surface) 21 (front face) of an $n^+$-type drain layer 2 as a first semiconductor region, an n-type drift layer 3 is formed as a second semiconductor region. On the other major surface 22 (back face) opposite to the one major surface 21 of this $n^+$-type drain layer 2, a drain electrode 1 as a first main electrode is formed.

A cell part (device region) to become a device center part is a region where an electric current flows in the ON-state. On a major surface (second major surface) 31 (front face) of the n-type drift layer 3 in the cell part, opposite to the $n^+$-type drain layer 2, a p-type base layer 5 as a third semiconductor region is selectively formed, and on a major surface 51 (front face) of this p-type base layer 5, an n-type source layer 6 as a fourth semiconductor region is formed selectively and in the stripe shape, respectively.

On a region from the p-type base layer 5 and the n-type source layer 6 to the other p-type base layer 5 and the n-type source layer 6 via the n-type drift layer 3, a gate electrode 8 as a control electrode is formed in a stripe shape via a gate insulating film 7, e.g., a Si (silicon) oxide film, having a film thickness of approximately 0.1 µm. On the one p-type base layer 5 and the n-type source layer 6 and on the other p-type base layer 5 and the n-type source layer 6, a source electrode 9 as a second main electrode is formed in a stripe shape to sandwich the gate electrode 8 therebetween.

In the n-type drift layer 3 in a device termination part (termination region) on the outer periphery of the cell part, a plurality of embedded GR layers 11 are formed. In the example shown in FIGS. 1A to 1C, three embedded GR layers 11 are formed. The embedded GR layers 11 are provided at a rate of one layer for a breakdown voltage of approximately 100 to 200V, for example. The depth where the plurality of embedded GR layers 11 is formed becomes deeper toward a direction of a field stop electrode 13 on the outside from the device region (away from the second major surface (front face) 31 of the n-type drift layer 3 where the p-type base layer 5 is formed). In other words, the plurality of embedded GR layers 11 are provided so that the distance between the plurality of embedded GR layers 11 and the second major surface 31 along a direction from the second major surface 31 toward the first major surface 21 becomes longer toward outside from the device region.

By using such structure of the embedded GR layers 11, a high termination breakdown voltage and high reliability are obtained with a short termination length. The reason for that will be described with reference to a comparative example shown in FIGS. 2A to 2C. With the configuration of the comparative example shown in FIGS. 2A to 2C, although the structure of the cell in the device region is the same, embedded GR layers 11' in the termination region are all formed at the same depth from the surface of the n-type drift layer 3. In graphs shown in FIGS. 1A to 1C and FIGS. 2A to 2C, FIGS. 1A and 2A illustrate an electric field distribution along the plurality of embedded GR layers from the p-type base layer 5, respectively, FIGS. 1B and 2B illustrate an electric field distribution on the surface of the n-type drift layer 3, and FIGS. 1C and 2C illustrate an electric field distribution in the depth direction of the n-type drift layer 3.

Since the termination breakdown voltage is determined by avalanche breakdown at the p-type base layer 5 end, it is determined by the electric field distribution from the p-type base layer 5 end to the embedded GR layer 11 end. In order to obtain a high termination breakdown voltage, it is only necessary that an interval between the p-type base layer 5 end and the embedded GR layer 11 and an interval between the adjacent embedded GR layers 11 are optimized so that this electric field distribution becomes flat, that is, the same peak value is shared (See FIGS. 1A and 2A).

Then, as in the structure of the comparative example shown in FIGS. 2A to 2C, if all the embedded GR layers 11 are formed at positions close to the surface at the same depth, being subjected to an influence of a high electric field peak at the p-type base layer 5 end and the embedded GR layer 11 end, the electric field on the surface of the n-type drift layer 3 also becomes high. The electric field on the surface of the n-type drift layer 3 has a peak PK at positions of an end portion outside the p-type base layer 5 and an end portion outside the embedded GR layer 11', respectively. Particularly, the farther outward from the device region, the higher the peak PK of the electric field tends to become, and a hot carrier can be easily generated (See FIG. 2B). As a result, reliability deterioration can occur easily.

On the contrary, in the structure of this embodiment shown in FIGS. 1A to 1C, the farther outward from the device region, at the deeper positions the embedded GR layers 11 are formed. As a result, the influence of the electric field at the embedded GR layer 11 end hardly reaches the surface of the n-type drift layer 3 easily, and the surface electric field is lowered. Particularly since the farther outward from the device region, the deeper the embedded GR layer 11 is provided, the farther outward from the device region on the surface of the n-type drift layer 3, the lower the peak PK of the electric field tends to become. The electric field on the surface of the n-type drift layer 3 has the peak PK at the positions on the end portion outside the p-type base layer 5 and the end portion outside the GR embedded layer 11, respectively (See FIG. 1B). Therefore, generation of a hot carrier is suppressed, and high reliability can be obtained.

In order to obtain high reliability in the structure of the comparative example, the number of GRs needs to be increased so as to lower the electric field peak value, whereby the termination length is made longer. On the contrary, in the structure of this embodiment, by providing the peak of the electric field distribution in the diagonal direction, even if the number of GRs is increased and the substantial termination length that holds the breakdown voltage is longer, the termination length in the direction along the surface can be made shorter.

The structure of the embedded GR layer 11 of this embodiment can be formed by a method of repeating a process of growing an embedded crystal after ion implantation or a method of highly accelerated ion implantation in which an acceleration voltage is changed in accordance with the embedded depth of the embedded GR layer 11. The plurality of embedded GR layers 11 are formed so as to surround the device region. Also, a difference in the depths of the adjacent embedded GR layers 11 may be constant or become larger or smaller as going outward from the device region.

Another Example of First Embodiment: No. 1

Figure 3:
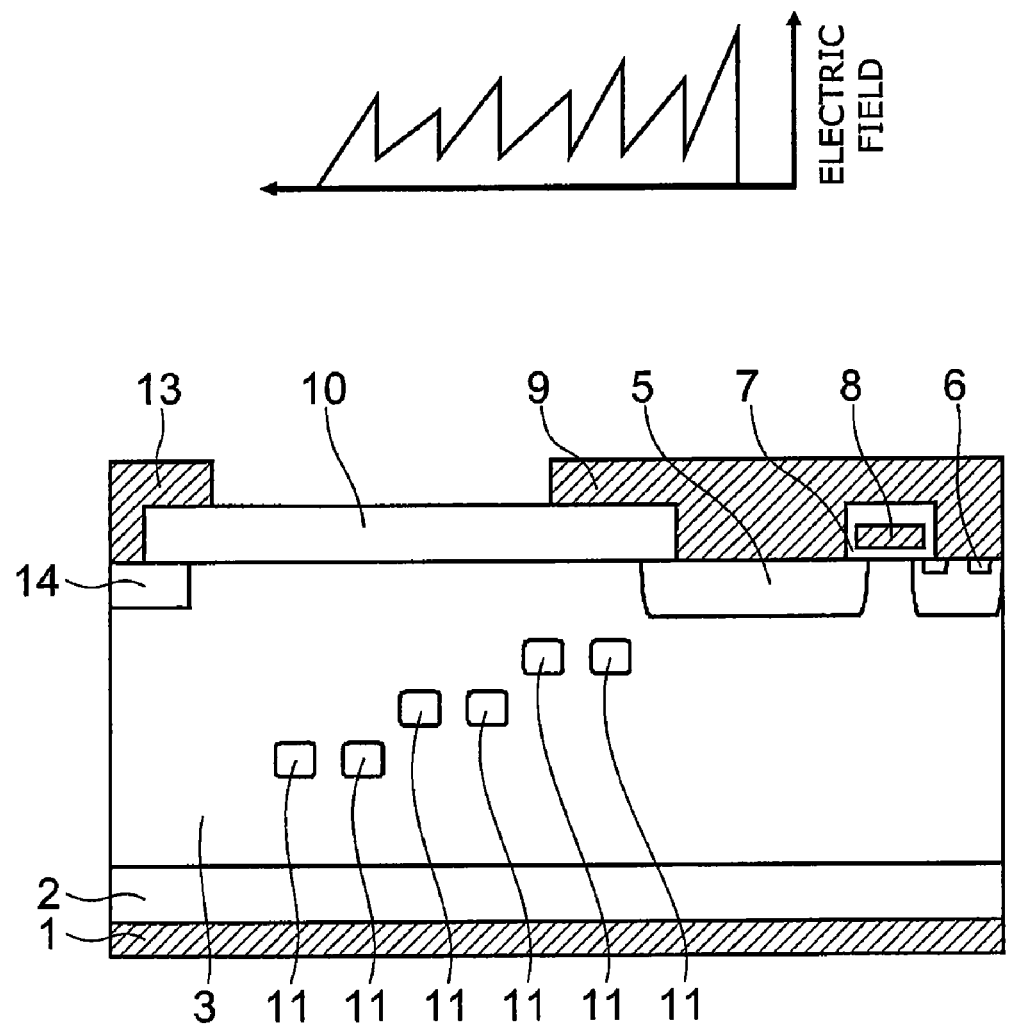
FIG. 3 is a cross-sectional view schematically illustrating an example of the configuration of a power MOSFET for explaining another example (No. 1) of the first embodiment.

FIG. 3 is a cross-sectional view schematically illustrating an example of the configuration of the power MOSFET for explaining another example (No. 1) of the first embodiment. Detailed description on the same parts as in FIGS. 1A to 1C is omitted, and only different parts will be described.

In the structure shown in FIGS. 1A to 1C described above, the depth where each embedded GR layer 11 is formed is changed, but in the structure shown in FIG. 3, a plurality of the embedded GR layers 11 are formed at the same depth, and the positions where they are formed become deeper in stages. In the structure shown in FIG. 3, for example, six embedded GR layers 11 are formed, and each pair composed of two layers (three pairs in FIG. 3) is formed at the same depth. Also, among the three pairs of the embedded GR layers 11, the farther outward from the device region the pair is located, the deeper from the surface of the n-type drift layer 3 it is formed.

A graph shown in FIG. 3 illustrates an electric field distribution on the surface of the n-type drift layer 3. With this electric field distribution, by adjusting the positions of the two embedded GR layers 11 of the same pair, it is possible to configure such that the farther outward from the device region the pair is located, the lower the peak of the electric field becomes. With this structure as well, the same effect as in the structure shown in FIGS. 1A to 1C is obtained.

In the structure shown in FIG. 3, the example in which a pair to be formed at the same depth is composed of two embedded GR layers 11 is described, but the number of layers may be three or more. Also, the number of pairs to be formed at the same depth is not limited to three pairs as shown in FIG. 3.

Another Example of First Embodiment: No. 2

Figure 4:
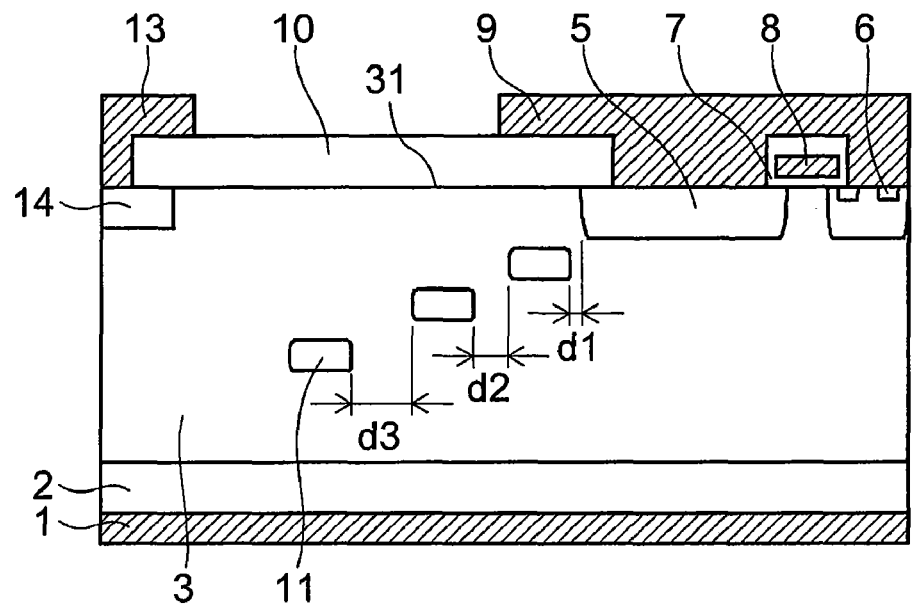
FIG. 4 is a cross-sectional view schematically illustrating an example of the configuration of a power MOSFET for explaining another example (No. 2) of the first embodiment.

FIG. 4 is a cross-sectional view schematically illustrating an example of the configuration of the power MOSFET for explaining another example (No. 2) of the first embodiment. Here, detailed description will be omitted for the same parts as in FIGS. 1A to 1C, and only different parts will be described.

The structure shown in FIG. 4 is configured such that the further outward from the device region, the wider the lateral interval (direction along the second major surface 31) of the embedded GR layers 11 becomes. For example, in the structure shown in FIG. 4, three embedded GR layers 11 are formed, and supposing that the lateral interval between the p-type base layer 5 and the adjacent embedded GR layer 11 is $d_1$, the lateral interval between this embedded GR layer 11 and the adjacent embedded layer GR layer 11 is $d_2$, and the lateral interval between this embedded GR layer 11 and the adjacent embedded GR layer 11 is d3, they are formed so that a relationship of d1<d2<d3 is established. In this structure, the electric field at the embedded GR layer 11 end becomes lower toward the outside than the structure shown in FIGS. 1A to 1C. As a result, the electric field outside the device on the surface of the termination region can be reliably lowered, whereby high reliability can be obtained.

Another Example of First Embodiment: No. 3

Figure 5:
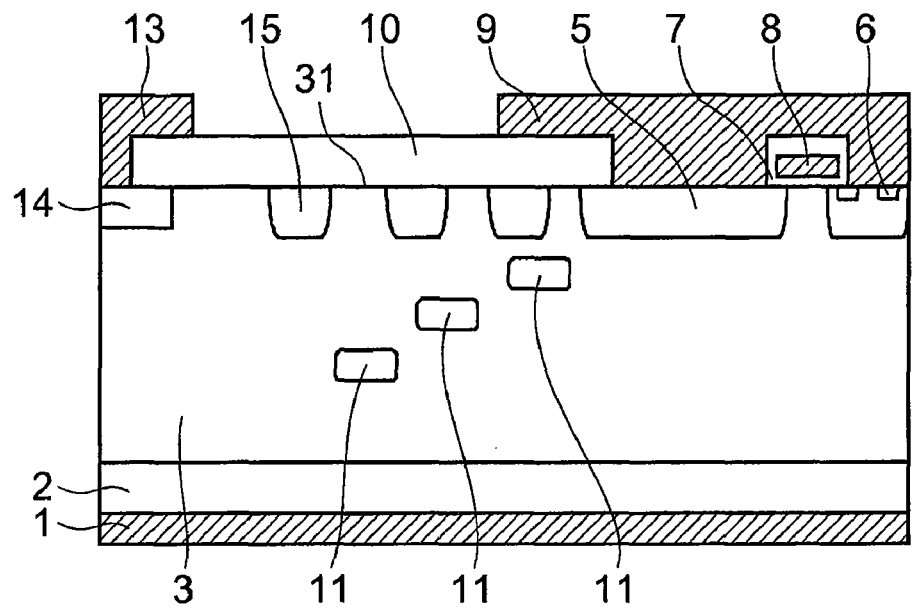
FIG. 5 is a cross-sectional view schematically illustrating an example of the configuration of a power MOSFET for explaining another example (No. 3) of the first embodiment.

FIG. 5 is a cross-sectional view schematically illustrating an example of the configuration of the power MOSFET for explaining another example (No. 3) of the first embodiment. Here, detailed description will be omitted for the same parts as in FIGS. 1A to 1C, and only different parts will be described.

In the structure shown in FIG. 5, in addition to the embedded GR layers 11 embedded in the n-type base layer 3, surface GR layers 15 are formed on the termination region surface (second major surface 31). By forming the surface GR layer 15, the electric field distribution on the termination surface can be adjusted not only by the design of the embedded GR layers 11 but also of the surface GR layers 15. The number of the surface GR layers 15 and the number of the embedded GR layers 11 do not have to be equal.

Another Example of First Embodiment: No. 4

Figure 6:
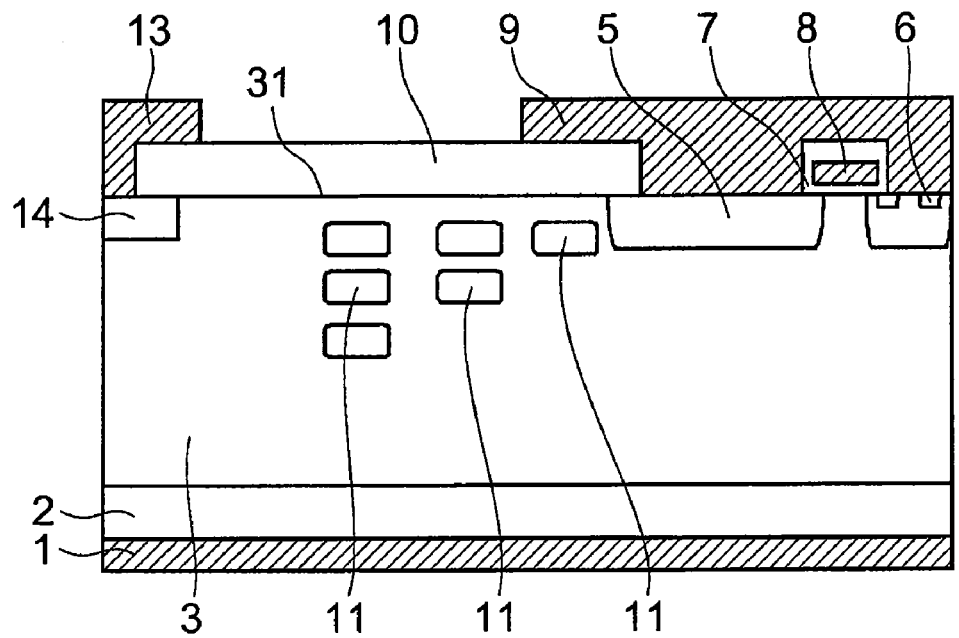
FIG. 6 is a cross-sectional view schematically illustrating an example of the configuration of a power MOSFET for explaining another example (No. 4) of the first embodiment.

FIG. 6 is a cross-sectional view schematically illustrating an example of the configuration of the power MOSFET for explaining another example (No. 4) of the first embodiment. Here, detailed description will be omitted for the same parts as in FIGS. 1A to 1C, and only different parts will be described.

The structure shown in FIG. 6 is configured such the number of the embedded GR layers 11 in the vertical direction is increased toward the outside of the device region. In the example shown in FIG. 6, the number of embedded GR layers 11 in the vertical direction is increased as 1, 2, and 3 from the side close to the p-type base layer 5 side to the side far from there. Due to the increase in the number of GRs in the vertical direction, the electric field peak position is located at the deepest embedded GR layers 11, which is equal to the increased depth of the GR. As a result, the electric field on the termination surface can be lowered, high reliability can be obtained. The increase in the number of embedded GR layers 11 in the vertical direction shown in FIG. 6 is an example, and the increase may be made by two instead of one or by non-equal difference.

Second Embodiment

Figure 7:
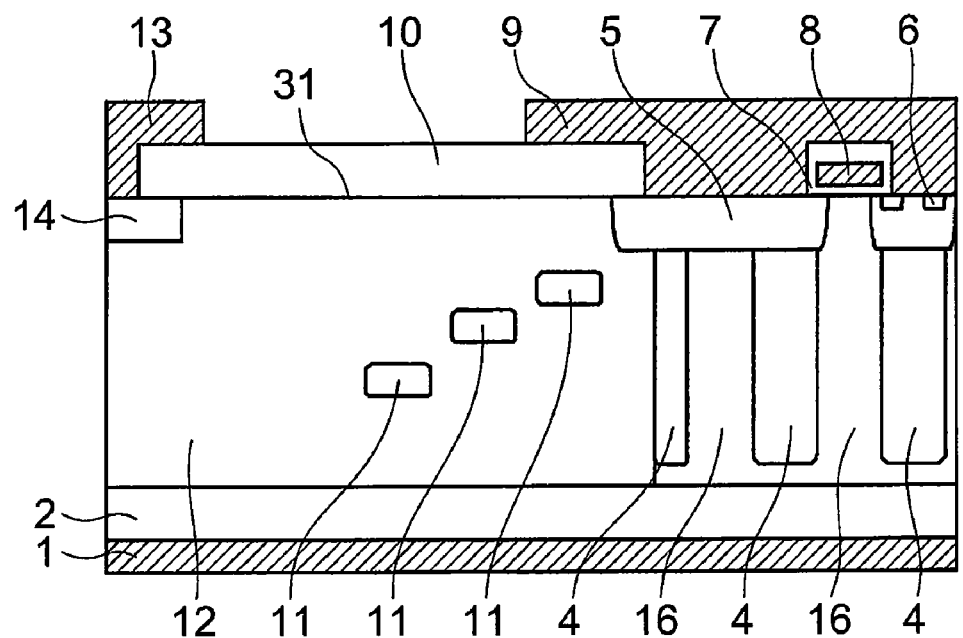
FIG. 7 is a cross-sectional view schematically illustrating an example of the configuration of a power MOSFET for explaining a second embodiment.

FIG. 7 is a cross-sectional view schematically illustrating an example of the configuration of the power MOSFET for explaining a second embodiment. Here, detailed description will be omitted for the same parts as in FIGS. 1A to 1C, and only different parts will be described.

In the structure shown in FIG. 7, a super junction structure of a laterally periodic n-type pillar layer 16 and a p-type pillar layer 4 is formed in a drift layer of a cell part (device region). The drift layer in the termination region is formed by a high resistance layer 12. The impurity concentration of the n-type pillar layer 16 is higher than the concentration of the high resistance layer by 10 times or more, for example. As a result, a low ON resistance is obtained.

Also in the configuration in which the super junction structure is formed in the cell part, a plurality of embedded GR layers 11 are formed in the termination region so that the formation positions become deeper (farther from the surface of the high resistance layer 12) toward the outside of the device region. As a result, the size of the termination surface can be made smaller with a short termination length, and high reliability can be obtained.

Another Example of Second Embodiment: No. 1

Figure 8:
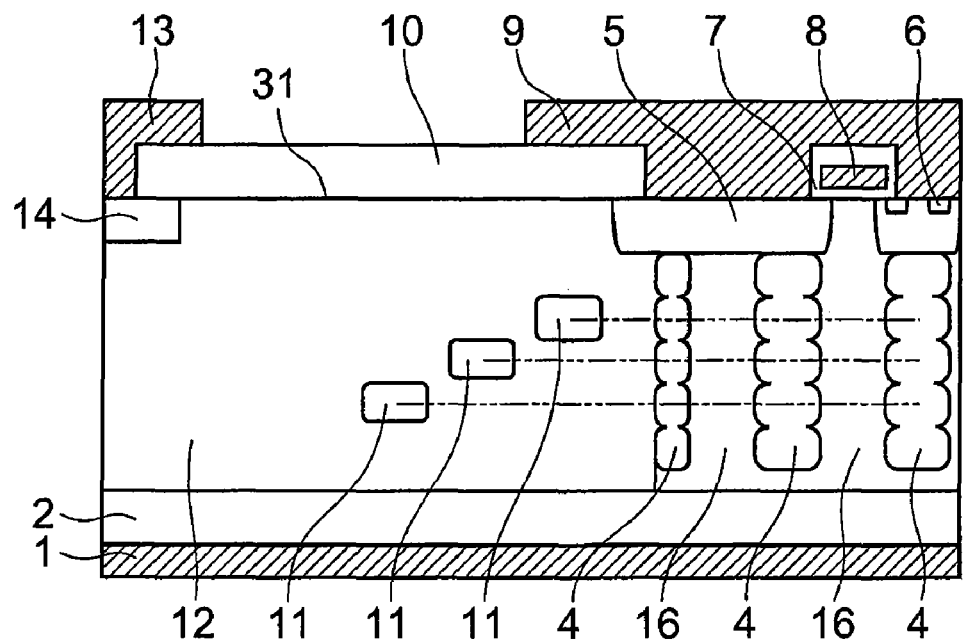
FIG. 8 is a cross-sectional view schematically illustrating an example of the configuration of a power MOSFET for explaining another example (No. 1) of the second embodiment.

FIG. 8 is a cross-sectional view schematically illustrating an example of the configuration of the power MOSFET for explaining another example (No. 1) of the second embodiment. Here, detailed description will be omitted for the same parts as in FIG. 7, and only different parts will be described.

In the structure shown in FIG. 8, the p-type pillar layer 4 in the super junction structure is divided into a plurality of layers in the perpendicular direction, and an impurity is implanted into each layer. As a result, a structure in which impurities are diffused to the periphery in each p-type pillar layer 4, that is, a structure having a concentration profile in which the impurity concentration has a plurality of peaks in the perpendicular direction is obtained. Moreover, in this structure, embedded GR layers 11 are provided in accordance with the layers in the super junction structure. That is, they are provided such that a depth of the center part of the embedded GR layer 11 matches the depth to become a peak of the impurity concentration of the p-type pillar layer 4. In the example shown in FIG. 8, there are five impurity concentration peaks of the p-type pillar layer 4 along the perpendicular direction, and the depths of the center parts of the three embedded GR layers 11 match the second to fourth impurity concentration peaks.

Here, in order to manufacture the super junction structure divided in plural layers, it is formed by a process of repeating ion implantation and embedded crystal growth in the super junction structure. By means of the ion implantation in each layer, a diffusion region of the p-type pillar layer 4 is composed. In such a process, the embedded GR layer 11 is formed at the same time with embedded crystal growth and ion implantation in each layer of the p-type pillar layer 4. As a result, the embedded GR layer 11 is formed in accordance with the position of the layer (the depth to become the peak of the impurity concentration) in the super junction structure.

In the super junction structure, in order to raise a breakdown voltage in the device region, the impurity concentration in the p-type pillar layer 4 is strictly controlled. In the structure shown in FIG. 8, since the embedded GR layer 11 is formed in the same process as that of the p-type pillar layer 4, the impurity concentration of the embedded GR layer 11 is strictly controlled along with that of the p-type pillar layer. As a result, the electric field distribution can be controlled with accuracy not only by the interval between the embedded GR layers 11 but also by the concentration of the embedded GR layer 11. Thus, even if the interval between the embedded GR layers 11 is fluctuated due to alignment fluctuation in a lithography process, once the electric field distribution is determined by the impurity concentration of the embedded GR layer 11, the alignment is not subjected to the fluctuation, and high reliability can be obtained.

Also, the embedded GR layer 11 can be formed at the same time with the p-type pillar layer 4, but if the embedded GR layer 11 is fully depleted by a low voltage similarly to the p-type pillar layer 4, it does not work as a GR any longer. Thus, the embedded GR layer 11 preferably has a higher impurity concentration than the p-type pillar layer 4 so that the embedded GR layer is not fully depleted even if a high voltage is applied. By making a mask opening width of the embedded GR layer 11 during ion implantation wider than the mask opening width of the p-type pillar layer 4, the impurity concentration of the embedded GR layer 11 can be made higher than the impurity concentration of the p-type pillar layer 4.

Another Example of Second Embodiment: No. 2

Figure 9:
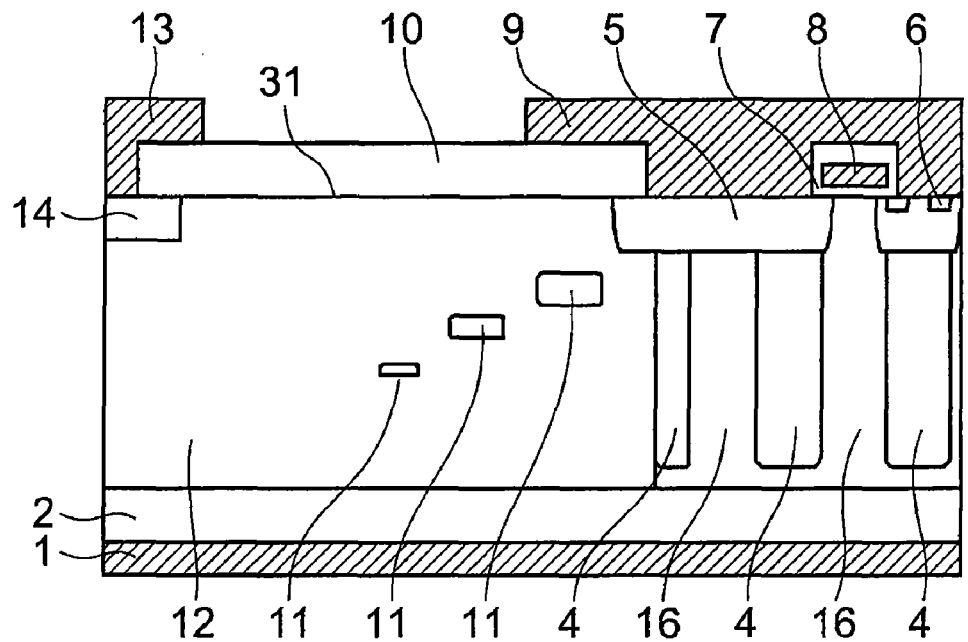
FIG. 9 is a cross-sectional view schematically illustrating an example of the configuration of a power MOSFET for explaining another example (No. 2) of the second embodiment.

FIG. 9 is a cross-sectional view schematically illustrating an example of the configuration of the power MOSFET for explaining another example (No. 2) of the second embodiment. Here, detailed description will be omitted for the same parts as in FIG. 7, and only different parts will be described.

In the structure shown in FIG. 9, the impurity concentration of the embedded GR layer 11 is made lower toward the outside of the device region. As a result, the same effect as the structure in which the interval between the plurality of embedded GR layers 11 is made wider toward the outside of the device region can be obtained, the electric field outside the termination surface can be reliably lowered, and high reliability can be obtained.

Third Embodiment

Figure 10:
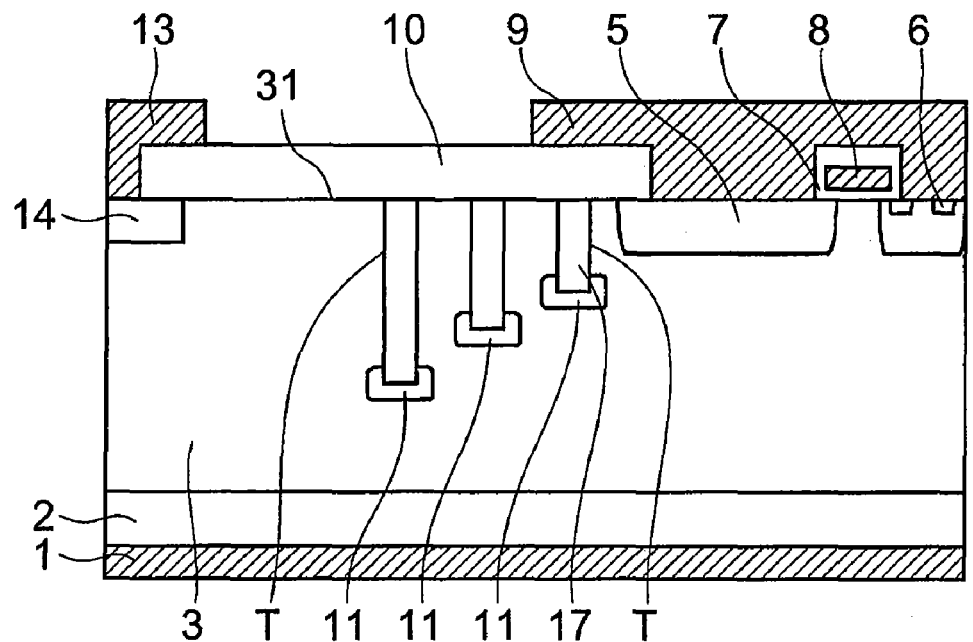
FIG. 10 is a cross-sectional view schematically illustrating an example of the configuration of a power MOSFET for explaining a third embodiment.

FIG. 10 is a cross-sectional view schematically illustrating an example of the configuration of the power MOSFET for explaining a third embodiment. Here, detailed description will be omitted for the same parts as in FIGS. 1A to 1C, and only different parts will be described.

In the structure shown in FIG. 10, a trench T in which an insulator 17 is embedded is formed in the termination region, and the embedded GR layer 11 is formed in the bottom part of the trench T. Such a structure can be formed by forming the trench T by etching and then, by implanting ion into the bottom part so as to form the embedded GR layer 11, which is a relatively easy process.

Figure 11:
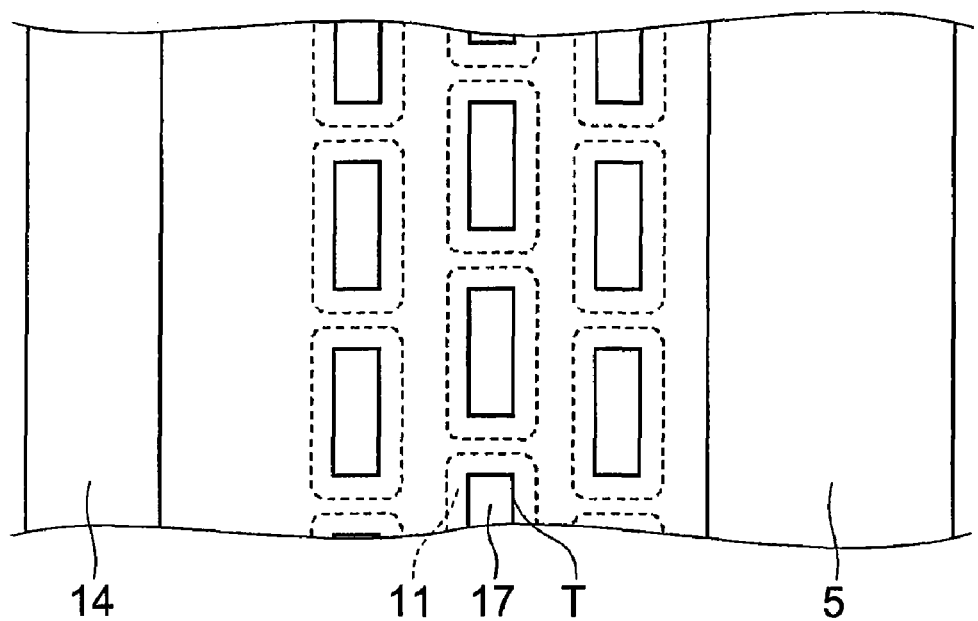
FIG. 11 is a schematic plan view for explaining a plane pattern of an insulator.

In this structure, if movement of a carrier in the termination region is inhibited by the insulator 17, the electric field distribution is changed by the accumulated carriers, and thus, a plane pattern as shown in FIG. 11 is preferable. That is, the trench T in which the insulator 17 is formed is provided discontinuously on a plan view. Here, the insulator 17 to be discontinuous is provided such that discontinued positions are different or the same in each row. Also, the insulator 17 to be discontinuous is provided such that the length along the row direction (vertical direction in the figure) is the same or different in each row.

If the trench T in which the insulator 17 is formed is formed in the stripe shape (continuously) unlike the above structures, a movement path of the carrier is divided on the surface side, and carriers are accumulated. However, as shown in FIG. 11, by forming the trench T in which the insulator 17 is formed in a broken line state, the carrier can move by using the portion where the insulator 17 is missing, and the carriers are not accumulated. Even if the embedded GR layer 11 is not formed in the stripe shape, a potential is fixed by the embedded GR layer 11, the electric field at the p-type base layer 5 and the embedded GR layer 11 end is relaxed, and the same effect is obtained.

Also, the embedded GR layer 11 might be formed discontinuously in accordance with the position of the insulator 17, or the impurities might be diffused by ion implantation performed from the bottom part of the trench T, and the adjacent layers might be connected and provided continuously. Even if the embedded GR layers 11 are continuous, since the insulator 17 is formed discontinuously as shown in FIG. 11, the carriers are not accumulated.

Another Example of Third Embodiment: No. 1

Figure 12:
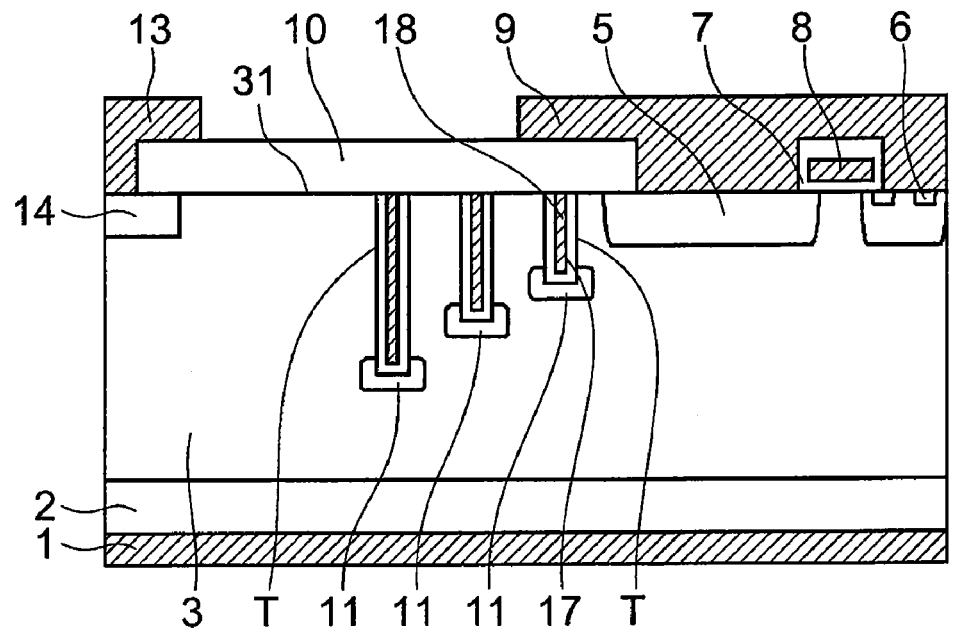
FIG. 12 is a cross-sectional view schematically illustrating an example of the configuration of a power MOSFET for explaining another example (No. 1) of the third embodiment.

FIG. 12 is a cross-sectional view schematically illustrating an example of a configuration of the power MOSFET for explaining another example (No. 1) of the third embodiment. Here, detailed description will be omitted for the same parts as in FIG. 10, and only different parts will be described.

In the structure shown in FIG. 12, the inside of the trench T is filled with the insulator 17 and poly Si (silicon) 18. That is, a film is formed by the insulator 17 on the inner wall of the trench T, and the inside of the trench T is filled with the poly Si 18 through this insulator 17. With this structure as well, the same effect can be obtained.

Another Example of Third Embodiment: No. 2

Figure 13:
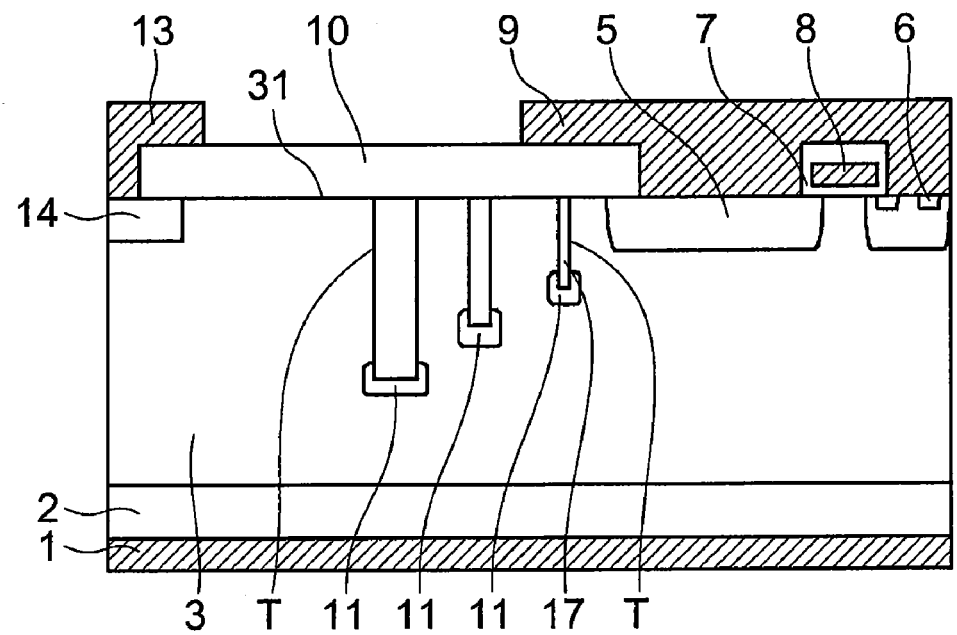
FIG. 13 is a cross-sectional view schematically illustrating an example of the configuration of a power MOSFET for explaining another example (No. 2) of the third embodiment.

FIG. 13 is a cross-sectional view schematically illustrating an example of the configuration of the power MOSFET for explaining another example (No. 2) of the third embodiment. Here, detailed description will be omitted for the same parts as in FIG. 10, and only different parts will be described.

In the structure shown in FIG. 13, the opening size of the trench T is changed. In an example shown in FIG. 13, the trenches T are provided so that their opening sizes become larger toward the outside from the device region. As a result, an etching speed of the n-type drift layer 3 when the trench T is formed is changed in accordance with the opening size, and the larger the opening size of the trench T is, the faster the etching speed becomes, and an etching depth can be made deeper. And by implanting ion from the bottom part of each trench T, the embedded GR layers 11 with different depths are formed. As a result, it becomes possible to form the trenches T with different depths in one etching process and to easily form the embedded GR layers 11 with different depths.

Figure 14:
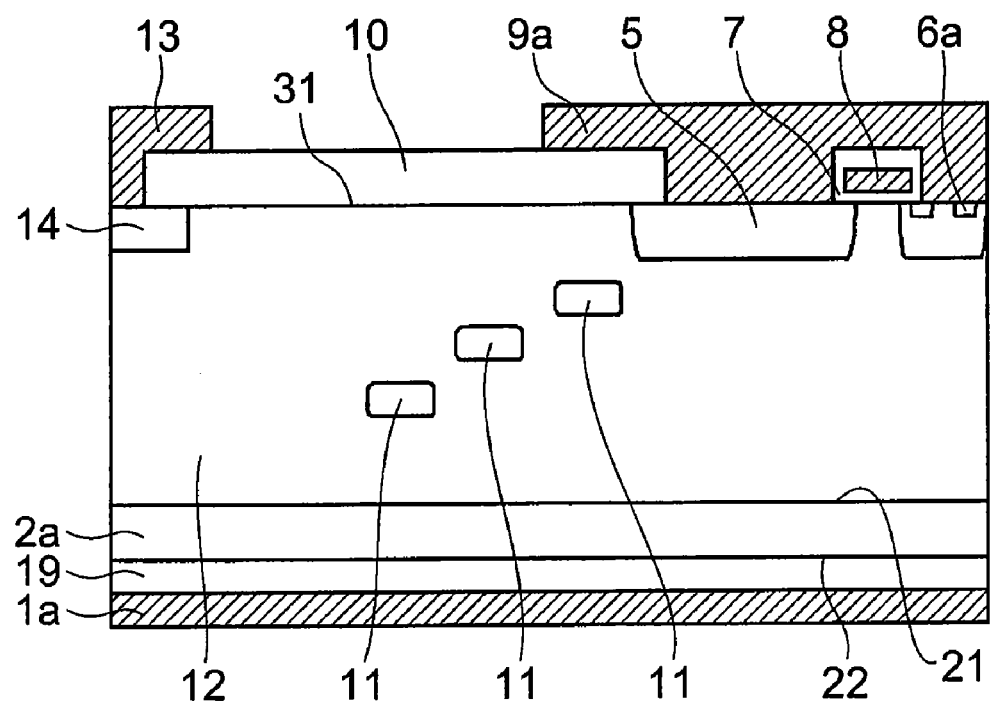
FIG. 14 is a schematic cross-sectional view for explaining an application example to an IGBT.

In the above exemplary embodiments, the vertical MOSFET is mainly exemplified and described, but the invention can also be applied to an IGBT. FIG. 14 is a schematic cross-sectional view for explaining an application example to the IGBT. As shown in FIG. 14, the vertical IGBT has a p-type collector layer 19 formed as a fifth semiconductor region on the other major surface 22 side of an $n^+$-type buffer layer 2a as a first semiconductor region, and a collector electrode 1a is connected to the p-type collector layer 19.

Although individual names or a part of the structure is different from the MOSFET shown in FIG. 7, the structure is the same. That is, the $n^+$-type drain layer 2 and the drain electrode 1 shown in FIG. 7 correspond to the $n^+$-type buffer layer 2a and the collector electrode 1a shown in FIG. 14. The source electrode 9 and the n-type source layer 6 correspond to an emitter electrode 9a and an emitter layer 6a shown in FIG. 14. Also, the IGBT is configured such that the p-type collector layer 19 is sandwiched between the drain electrode 1 and the $n^+$-type drain layer 2 in the MOSFET shown in FIG. 7. The p-type collector layer 19 may be disposed instead of the $n^+$-type drain layer 2 in the MOSFET shown in FIG. 7. With the IGBT as well, the effect can be obtained similarly to the other of the above exemplary embodiments.

The first to third embodiments have been described, but the invention is not limited to the first to third embodiments. For example, although the first conductivity type is the n-type and the second conductivity type is the p-type in the description of the exemplary embodiments, but the first conductivity type may be the p-type and the second conductivity may be the n-type. Also, for example, although the plane pattern of the device region is in the stripe shape in the description, the plane pattern may be others such as a mesh state, an offset-mesh state, a honeycomb state and the like. Also, for example, any addition, deletion or design change of constituent elements made by those skilled in the art as appropriate to each of the above exemplary embodiments or the variations thereof or appropriate combinations of characteristics of each of the exemplary embodiments are also included in the scope of the invention as long as the gist of the invention is provided.

Also, in the configuration shown in FIG. 5 described in another example of the first embodiment (No. 3), the example in which the GR layer is formed on the surface of the termination part is shown, but a field plate structure, a RESURF structure, a floating field plate structure and the like may be formed. Also, in the second embodiment, the outermost part of the super junction structure is the p-type pillar layer, but the similar effect can be obtained by the similar design using the n-type pillar layer. Also, although the MOS gate structure is a planar structure in the description, the structure may be the trench structure.

Also, the high resistance layer 12 does not have to be a fully intrinsic semiconductor, and a high breakdown voltage can be obtained as long as the concentration is sufficiently small for the n-type pillar layer 3, the impurity concentration being preferably that of $1/10$ or less of the n-type pillar layer 3. And the n-type is preferable so that the electric field not on the outer periphery part of the device region but on the inside (cell side) of the device region is higher.

Also, in the second embodiment, the method of forming the p-type pillar layer 4 by a process of repeating ion implantation and embedded crystal growth is described, but the n-type pillar layer 16 may be formed similarly by a process of repeating ion implantation and embedded crystal growth. As a result, concentrations of the high resistance layer 12 and the n-type pillar layer 16 can be changed.

Also, although the vertical device is described using the power MOSFET or IGBT, the invention can be applied to a device of other configurations such as a diode, provided with the embedded GR layer 11. In order to configure the semiconductor device of this exemplary embodiment as a diode, the gate electrode 8, the gate insulation film 7 and the n-type source layer 6 in the MOSFET structure shown in FIGS. 1A to 1C are eliminated, and the drain electrode 1 is a cathode electrode and the source electrode 9 is an anode electrode in the configuration.

Also, although the semiconductor device using silicon (Si) as the semiconductor is described, a wide bandgap semiconductor, for example, such as diamond, compound semiconductors such as silicon carbite (SiC) and a gallium nitride (GaN), etc., may be used as the semiconductor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a first semiconductor region of a first conductivity type;
a second semiconductor region of the first conductivity type formed on a first major surface of the first semiconductor region;
a first main electrode formed on a face side opposite to the first major surface of the first semiconductor region;
a third semiconductor region of a second conductivity type formed on a part of a second major surface of the second semiconductor region on a side opposite to the first semiconductor region;
a second main electrode formed to bond to the third semiconductor region; and
a plurality of embedded semiconductor regions of the second conductivity type provided in a termination region, the termination region being an outside of a device region, a main electric current path being formed between the first main electrode and the second main electrode in the device region of the second semiconductor region,
a distance between the embedded semiconductor region and the second major surface along a direction from the second major surface toward the first major surface becoming longer toward outside from the device region.

2. A semiconductor device, comprising:
a first semiconductor region of a first conductivity type;
a second semiconductor region of the first conductivity type formed on a first major surface of the first semiconductor region;
a first main electrode formed on a face on a side opposite to the first major surface of the first semiconductor region;
a third semiconductor region of a second conductivity type formed on a part of a second major surface of the second semiconductor region on a side opposite to the first semiconductor region;
a fourth semiconductor region of the first conductivity type formed on the third semiconductor region;
a second main electrode formed to bond to the third semiconductor region and the fourth semiconductor region;
a control electrode formed via a gate insulating film over the third semiconductor region, the fourth semiconductor region, and the second semiconductor region; and
a plurality of embedded semiconductor regions of the second conductivity type provided in a termination region, the termination region being an outside of a device region, a main electric current path being formed between the first main electrode and the second main electrode in the device region of the second semiconductor region,
a distance between the embedded semiconductor region and the second major surface along a direction from the second major surface toward the first major surface becoming longer toward outside from the device region.

3. The device according to claim 2, comprising
a plurality of semiconductor pillar regions of the second conductivity type formed to connect to the third semiconductor region in a direction perpendicular to the second major surface in the second semiconductor region and arranged periodically along a direction of the second major surface.

4. The device according to claim 3, wherein the semiconductor pillar region has a concentration profile having a plurality of peaks in impurity concentration along the direction perpendicular to the second major surface, and a depth at a center part of the embedded semiconductor region matches a depth to become the peak of the impurity concentration of the semiconductor pillar region.

5. The device according to claim 2, wherein a fifth semiconductor region of the second conductivity type is provided between the first semiconductor region and the first main electrode.

6. The device according to claim 3, wherein a fifth semiconductor region of the second conductivity type is provided between the first semiconductor region and the first main electrode.

7. The device according to claim 4, wherein a fifth semiconductor region of the second conductivity type is provided between the first semiconductor region and the first main electrode.

8. The device according to claim 1, wherein
the plurality of embedded semiconductor regions have a plurality of pairs;
the pair has a plurality of embedded semiconductor regions with the same depth from the second major surface along the direction from the second major surface to the first major surface; and
the plurality of pairs are provided so that the depth becomes deeper toward the outside from the device region.

9. The device according to claim 1, wherein an interval between the plurality of embedded semiconductor regions in the direction along the second major surface becomes wider toward the outside of the device region.

10. The device according to claim 1, wherein a guard ring is provided on the second major surface.

11. The device according to claim 1, wherein the number of the plurality of embedded semiconductor regions provided along the direction from the second major surface to the first major surface is increased toward the outside of the device region.

12. The device according to claim 1, wherein an impurity concentration of each of the plurality of embedded semiconductor regions becomes lower toward the outside of the device region.

13. The device according to claim 1, further comprising:
a trench provided in the second major surface along the direction from the second major surface to the first major surface; and
an insulator embedded in the trench,
the embedded semiconductor region being provided on a bottom part of the trench.

14. The device according to claim 13, wherein polysilicon is embedded inside the trench.

15. The device according to claim 13, wherein a plurality of the trenches are provided discontinuously along the second major surface.

16. The device according to claim 15, wherein
a size of each of the plurality of trenches along the second major surface becomes larger toward the outside from the device region.

* * * * *